United States Patent
Shinkai et al.

(10) Patent No.: US 8,643,180 B2
(45) Date of Patent: Feb. 4, 2014

(54) SEMICONDUCTOR DEVICE

(75) Inventors: Hiroyuki Shinkai, Kyoto (JP); Hiroshi Okumura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/003,424

(22) Filed: Dec. 26, 2007

(65) Prior Publication Data

US 2008/0150134 A1 Jun. 26, 2008

(30) Foreign Application Priority Data

Dec. 25, 2006 (JP) ................................. 2006-348572

(51) Int. Cl.
*H01L 23/48* (2006.01)
*H01L 23/52* (2006.01)
*H01L 29/40* (2006.01)

(52) U.S. Cl.
USPC ...... 257/738; 257/778; 257/779; 257/E23.02; 257/E23.021; 257/E23.023

(58) Field of Classification Search
USPC ............ 257/738, 751, 778, 779, 781, E23.01, 257/E23.019, E23.02, E23.021, E23.023, 257/E23.151, E23.16; 228/180.22
See application file for complete search history.

(56) References Cited

U.S. PATENT DOCUMENTS

| | | | |
|---|---|---|---|
| 5,757,078 A * | 5/1998 | Matsuda et al. ............... | 257/737 |
| 5,834,844 A | 11/1998 | Akagawa et al. | |
| 5,943,597 A * | 8/1999 | Kleffner et al. ............... | 438/613 |
| 5,960,308 A | 9/1999 | Akagawa et al. | |
| 6,323,542 B1 | 11/2001 | Hashimoto | |
| 6,338,980 B1 | 1/2002 | Satoh | |
| 6,413,851 B1 * | 7/2002 | Chow et al. .................... | 438/613 |
| 6,417,089 B1 * | 7/2002 | Kim et al. ...................... | 438/612 |
| 6,501,185 B1 * | 12/2002 | Chow et al. .................... | 257/780 |
| 6,515,372 B1 * | 2/2003 | Narizuka et al. ............... | 257/779 |
| 2002/0027269 A1 | 3/2002 | Hashimoto | |
| 2003/0052414 A1 * | 3/2003 | Cowens et al. ............... | 257/778 |
| 2003/0089969 A1 | 5/2003 | Hashimoto | |
| 2003/0222352 A1 * | 12/2003 | Kung et al. .................... | 257/772 |
| 2004/0229474 A1 * | 11/2004 | Tsai et al. ...................... | 438/754 |
| 2004/0266162 A1 * | 12/2004 | Feng ............................... | 438/613 |
| 2005/0020051 A1 * | 1/2005 | Tsai ............................... | 438/613 |
| 2005/0242436 A1 * | 11/2005 | Abe et al. ....................... | 257/737 |
| 2006/0038291 A1 * | 2/2006 | Chung et al. ................... | 257/738 |
| 2006/0068595 A1 * | 3/2006 | Seliger et al. .................. | 438/737 |

(Continued)

FOREIGN PATENT DOCUMENTS

JP        8340002      12/1996
JP     2001-127206     5/2001

(Continued)

*Primary Examiner* — Benjamin Sandvik
*Assistant Examiner* — Leslie Pilar Cruz
(74) *Attorney, Agent, or Firm* — Rabin & Berdo, P.C.

(57) ABSTRACT

A semiconductor device of the present invention includes a semiconductor chip; an internal pad for electrical connection formed on a surface of the semiconductor chip; a stress relaxation layer formed on the semiconductor chip and having an opening for exposing the internal pad; an under-bump layer formed so as to cover a face exposed in the opening on the internal pad, an inner face of the opening and a circumference of the opening on the stress relaxation layer; a solder terminal for electrical connection with outside formed on the under-bump layer; and a protective layer formed on the stress relaxation layer, encompassing a periphery of the under-bump layer and covering a side face of the under-bump layer.

54 Claims, 8 Drawing Sheets

(56) References Cited

U.S. PATENT DOCUMENTS

| | | |
|---|---|---|
| 2006/0220244 A1* | 10/2006 | Lu et al. .................. 257/738 |
| 2007/0187825 A1 | 8/2007 | Hashimoto |
| 2008/0079162 A1 | 4/2008 | Hashimoto |
| 2009/0111260 A1 | 4/2009 | Hashimoto |
| 2010/0240176 A1 | 9/2010 | Hashimoto |
| 2011/0095422 A1 | 4/2011 | Hashimoto |

FOREIGN PATENT DOCUMENTS

| | | |
|---|---|---|
| JP | 2005-191604 | 7/2005 |
| JP | 2006-60219 | 3/2006 |
| JP | 2006-237198 | 9/2006 |

* cited by examiner

SEMICONDUCTOR DEVICE

BACKGROUND OF THE INVENTION

1. Field of the Invention

The present invention relates to a semiconductor device, and in particular, a semiconductor device to which a Wafer Level-Chip Size Package (WL-CSP) technology is applied.

2. Description of Related Arts

Recently, as semiconductor devices become increasingly more sophisticated and multifunctional, commercialization of Wafer Level-Chip Size Package (hereinafter referred to as WL-CSP) technology has progressed as well. With WL-CSP technology, the packaging process is completed at the wafer-level, and the size of an individual chip cut out by dicing reaches the size of the package.

Figure 9:
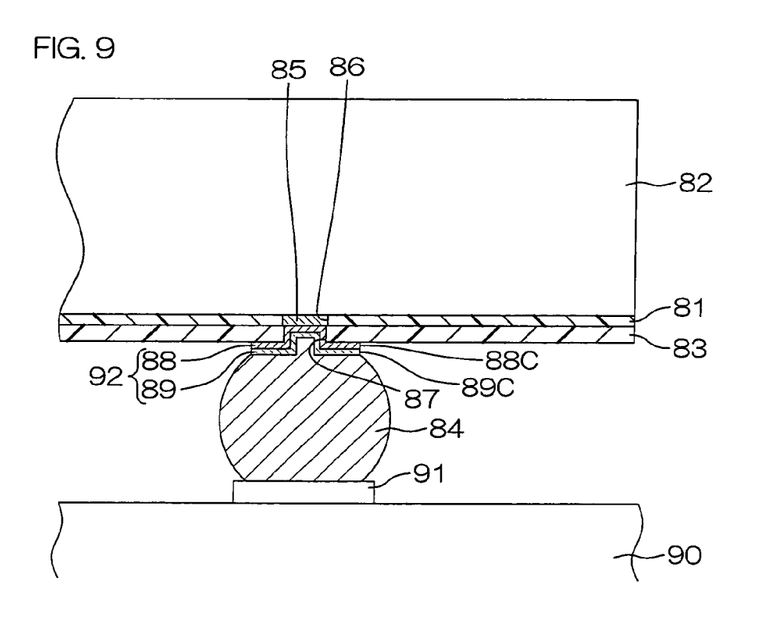
FIG. 9 is a schematic sectional view showing a configuration of a conventional semiconductor device and showing a state in which the semiconductor device is mounted on a mounting board.

A semiconductor device to which the WL-CSP technology is applied includes a semiconductor chip 82 with its face covered by a surface protective film 81, a stress relaxation layer 83 (polyimide, for example) laminated on the surface protective film 81 and a solder ball 84 arranged on the stress relaxation layer 83, as shown in FIG. 9. The surface protective film 81 is formed with a pad opening 86 for exposing a part of internal wiring in the semiconductor chip 82 as an electrode pad 85. The stress relaxation layer 83 is formed with a through-hole 87 for exposing the electrode pad 85 exposed from the pad opening 86.

An under-bump layer 92 is formed so as to cover a surface of the electrode pad 85, an inner face of the through-hole 87 and a circumference of the through-hole 87 on the surface of the stress relaxation layer 83. The under-bump layer 92 includes a barrier layer 88 (for example, titanium, tungsten titanium, and the like) and a metal plating layer 89 (for example, copper, gold, and the like) formed on the barrier layer 88. The solder ball 84 is provided on the surface of the metal plating layer 89 and electrically connected with the electrode pad 85 via the metal plating layer 89 and the barrier layer 88. Mounting of the semiconductor device on a mounting board 90 (electrical and mechanical connection relative to the mounting board 90) is achieved by connecting the solder ball 84 to a 91 on the mounting board 90.

In relationship to the metal plating layer 89, however, the solder ball 84 is fixed only to the surface of the metal plating layer 89. Consequently, a side face 88C of the barrier layer 88 and a side face 89C of the metal plating layer 89 are in a state of being exposed from between the solder ball 84 and the stress relaxation layer 83. If these exposed side faces 88C and 89C are subject to moisture such as dampness so that the barrier layer 88 and the metal plating layer 89 are corroded, the barrier layer 88 may be stripped off from the stress relaxation layer 83.

SUMMARY OF THE INVENTION

Accordingly, an object of the present invention is to provide a semiconductor device capable of preventing an under-bump layer from stripping off from a stress relaxation layer.

A semiconductor device of the present invention includes a semiconductor chip; an internal pad for electrical connection formed on a surface of the semiconductor chip; a stress relaxation layer formed on the semiconductor chip and having an opening for exposing the internal pad; an under-bump layer formed so as to cover a face exposed in the opening on the internal pad, an inner face of the opening and a circumference of the opening on the stress relaxation layer; a solder terminal for electrical connection with outside formed on the under-bump layer; and a protective layer formed on the stress relaxation layer, encompassing a periphery of the under-bump layer and covering a side face of the under-bump layer.

According to this configuration, the under-bump layer is formed on the face exposed in the opening on the inner pad, the inner face of the opening and the circumference of the opening on the stress relaxation layer so as to cover them. On the under-bump layer, the solder terminal for electrical connection with outside is formed. The side face of the under-bump layer is covered over its entire periphery with the protective layer.

Since the entire periphery of the side face of the under-bump layer is covered by the protective layer, the under-bump layer can be prevented from being corroded due to moisture exposure and stripping from the stress relaxation layer. As a result, stripping of the solder terminal from the semiconductor chip associated with the stripping of the under-bump layer can be prevented, whereby a semiconductor device with high connection reliability can be achieved.

In addition, the stress relaxation layer is preferably made of polyimide. The under-bump layer preferably includes a barrier layer made of a metal containing titanium or nickel and a connection pad laminated on the barrier layer and made of a metal having solder wettability.

According to this configuration, the stress relaxation layer made of polyimide and the barrier layer of the under-bump layer made of a metal containing titanium or nickel have low adherability, and thus stripping between the stress relaxation layer and the barrier layer is easily caused if the connection pad on the barrier layer is oxidized (corroded). In the configuration where the side face of the barrier layer is covered by the protective layer, oxidization in the connection pad from a laminating interface between the barrier layer and the connection pad, for example, can be prevented, so that stripping of the barrier layer from the stress relaxation layer can be prevented.

Furthermore, the solder terminal preferably covers the side face of the connection pad.

According to this configuration, oxidization (corrosion) of the connection pad can be prevented since the side face of the connection pad is not exposed. Consequently, the stripping of the barrier layer from the stress relaxation layer can be further prevented.

The above, or other objects, features and effects of the present invention will become apparent from the following explanation of embodiments with reference to the accompanying drawings.

DETAILED DESCRIPTION OF THE PREFERRED EMBODIMENTS

Figure 1:
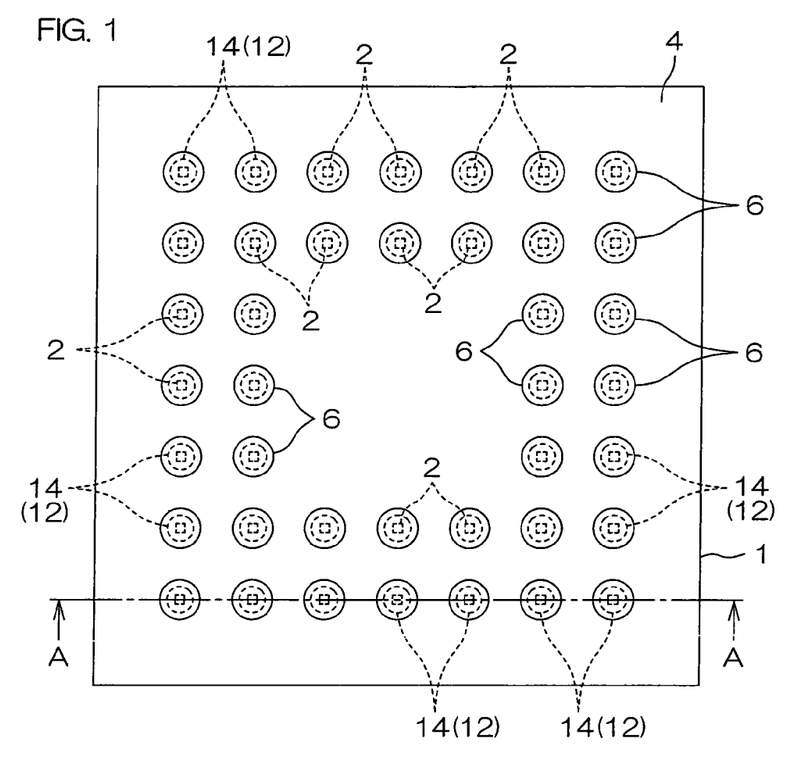
FIG. 1 is a schematic bottom plan view of a semiconductor device in accordance with a first embodiment of the present invention.
Figure 2:
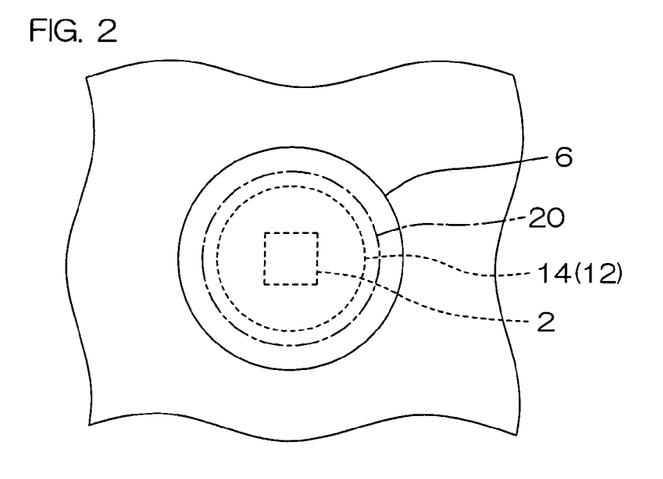
FIG. 2 is a schematic bottom plan view showing a periphery of a solder ball in FIG. 1 in an enlarged manner.
Figure 3:
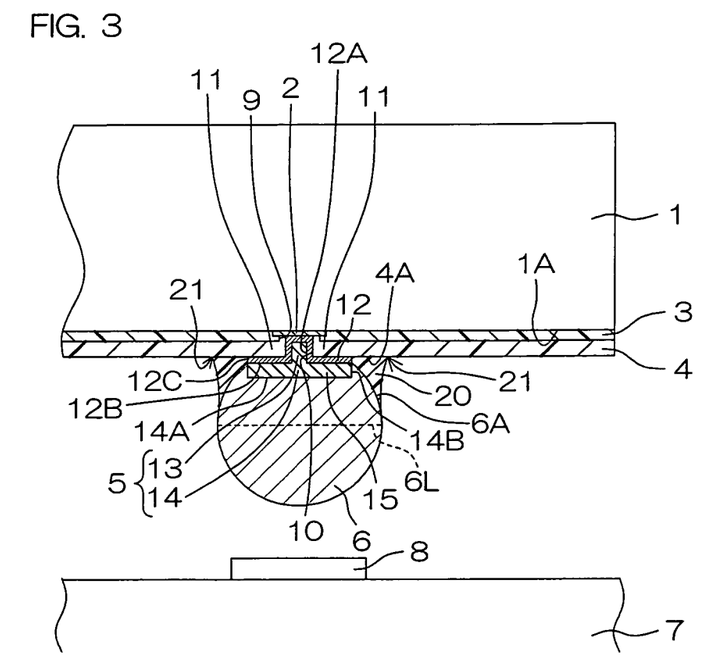
FIG. 3 is a sectional view taken along line A-A of FIG. 1.

FIG. 1 is a schematic bottom plan view (illustrating a joint surface onto a mounting board) of a semiconductor device in accordance with a first embodiment of the present invention. FIG. 2 is a schematic bottom plan view showing a periphery of a solder ball 6 in FIG. 1 in an enlarged manner. FIG. 3 is a sectional view taken along line A-A shown in FIG. 1. In FIG. 2 and FIG. 3, the semiconductor device is illustrated with its part omitted by breaking the semiconductor device with a break line.

The semiconductor device is manufactured by WL-CSP technology. The semiconductor device includes a semiconductor chip 1, a surface protective film 3 covering a function face 1A (a face where a function element is built) of the semiconductor chip 1, a stress relaxation layer 4 formed on the surface protective film 3, a connection pad 5 formed on the stress relaxation layer 4, and a solder ball 6 (a solder terminal) attached to the connection pad 5 for electrical connection with outside. Mounting of the semiconductor device onto a mounting board 7 (electrical and mechanical connection to the mounting board 7) is achieved by connecting the solder ball 6 to a pad 8 on the mounting board 7.

The semiconductor chip 1 is, for example, a generally rectangular silicon chip when viewed in plan view. The function face 1A is formed with a plurality of electrode pads 2 (inner pads).

The electrode pads 2 are, for example, generally rectangular aluminum pads when viewed in plane view, and electrically connected with the function element built on the function face 1A of the semiconductor chip 1. Further, the electrode pads 2 are arranged in two rows rectangularly and annularly when viewed in plan view along an outer periphery of the semiconductor chip 1. An appropriate spacing is provided between individual adjacent electrode pads 2 to each other (see FIG. 1).

The surface protective film 3 is made of silicon oxide or silicon nitride. The surface protective film 3 is formed with a pad opening 9 for exposing each electrode pad 2.

The stress relaxation layer 4 is made of polyimide, for example. The stress relaxation layer 4 is formed so as to cover an entire surface of the surface protective film 3 and has a function of absorbing and relaxing the stress applied on the semiconductor device. In addition, the stress relaxation layer 4 is formed with a through-hole 10 (an opening) penetrating therethrough at a position opposed to each electrode pad 2. The electrode pad 2 exposed from the pad opening 9 faces the outside through the through-hole 10. A barrier layer 12 is formed so as to cover a face exposed in the through-hole 10 on the electrode pad 2, an inner face of the through-hole 10 and a circumference 11 of the through-hole 10 on the stress relaxation layer 4.

The barrier layer 12 is made of, for example, a metal containing titanium or nickel (titanium, nickel, titanium tungsten, and the like) and has a function of preventing corrosion of the electrode pad 2. The barrier layer 12 is formed generally circular when viewed in plan view and, for example, having a thickness of 1000 to 2000 Å.

On the barrier layer 12, the connection pad 5 is formed. More specifically, the connection pad 5 is formed so as to contact with an inner face 12A of the barrier layer 12 within the through-hole 10 and an outer end face 12B of the barrier layer 12 on the stress relaxation layer 4. By this means, an under-bump metal (an under-bump layer) made of the barrier layer 12 and the connection pad 5 is formed, and a side face 12C of the barrier layer 12 on the stress relaxation layer 4 is an exposure face exposed from the connection pad 5.

The connection pad 5 is formed using a metal having solder wettability, for example, copper. The connection pad 5 includes a buried portion 13 buried in the through-hole 10 and a protruding portion 14 integrally formed with the buried portion 13 and protruding on the stress relaxation layer 4.

The buried portion 13 is formed cylindrically, for example, and electrically connected with the electrode pad 2 via the barrier layer 12.

The protruding portion 14 is formed cylindrically with a height of 10 to 50 μm, for example. Further, the protruding portion 14 is formed such that a width (diameter) in a width direction orthogonal to a laminating direction of the semiconductor chip 1 and the stress relaxation layer 4 is larger (wider) than an opening width (diameter) of the through-hole 10 in the same direction as above. (Each of the directions mentioned above is hereinafter referred to as "the width direction" and "the laminating direction", respectively, for simplicity.) Accordingly, a circumference 15 of the protruding portion 14 projects in the width direction and contacts with the outer end face 12B of the barrier layer 12.

The solder ball 6 is formed, for example, in the shape of generally a sphere using solder, and covers an entire surface (a distal end face 14A and a side face 14B) of the protruding portion 14 of the connection pad 5. By forming the generally spherical solder ball 6, a gap 21 faced with a surface 4A of the stress relaxation layer 4, the side face 12C of the barrier layer 12 and a spherical face 6A of the solder ball 6 is formed between a central circumference 6L of the solder ball 6 in the width direction and the stress relaxation layer 4.

An organic protective film 20 (protective layer) is formed in the gap 21. The organic protective film 20 is made of, for example, polyimide which is an organic material with low absorbability. In the gap 21, the organic protective film 20 is formed generally annular when viewed in plan view to surround a periphery of the barrier layer 12 and contactingly covers the side face 12C of the barrier layer 12 (see FIG. 2).

FIGS. 4A to 4H are schematic sectional views showing a manufacturing method of the semiconductor device shown in FIG. 1.

Figure 4A:
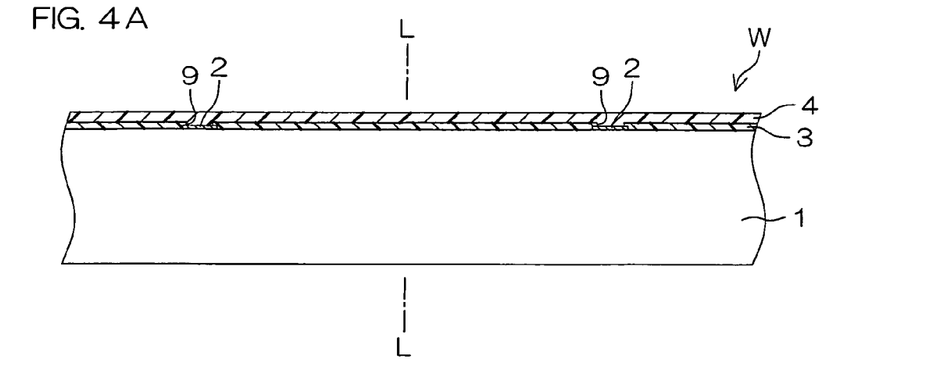
FIG. 4A is a schematic sectional view showing a manufacturing method of the semiconductor device in FIG. 1 in process order.

In manufacturing the semiconductor device, first, a plurality of semiconductor chips 1 are made, as shown in FIG. 4A, to prepare a semiconductor wafer W with the entire surface of the semiconductor chips 1 covered by the surface protective film 3. Further, the surface protective film 3 is formed with the pad opening 9 exposing the electrode pad 2. In a state of the semiconductor wafer W, the stress relaxation layer 4 is formed on the surface protective film 3.

Figure 4B:
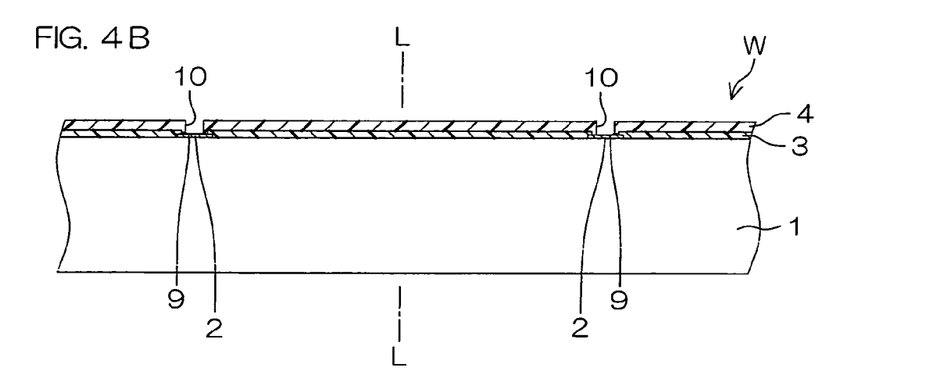
FIG. 4B is a schematic sectional view showing the manufacturing method of the semiconductor device in FIG. 1 in process order and showing the subsequent process of FIG. 4A.
Figure 4C:
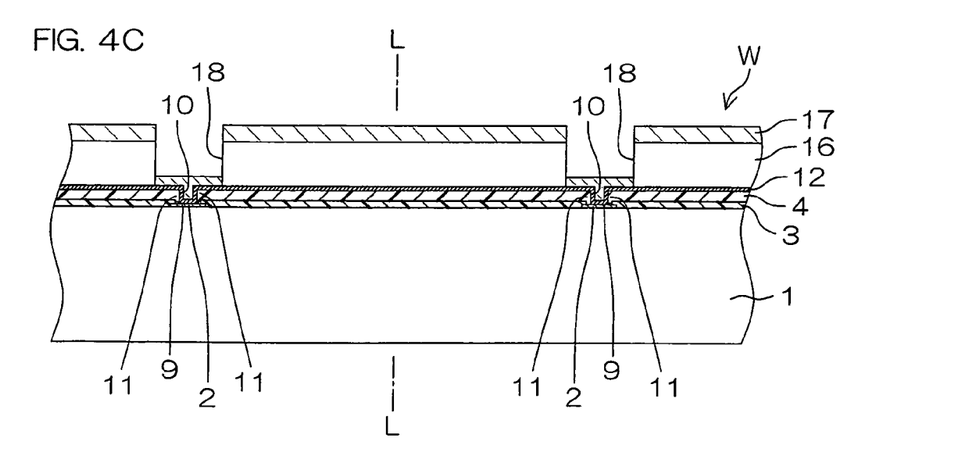
FIG. 4C is a schematic sectional view showing the manufacturing method of the semiconductor device in FIG. 1 in process order and showing the subsequent process of FIG. 4B.

Next, the through-hole 10 is formed on the stress relaxation layer 4 as shown in FIG. 4B. After the through-hole 10 is formed, the barrier layer 12, a photoresist 16 and a metal layer 17 are formed on the semiconductor wafer W in this order as shown in FIG. 4C. More specifically, first, the barrier layer 12 is formed on the whole area of the semiconductor wafer W by a sputtering method. The photoresist 16 having an opening 18 on an area where the protruding portion 14 (see FIG. 3) of the connection pad 5 is to be formed is formed on the barrier layer 12 by a known photolithography technology. After the photoresist 16 is formed, the metal layer 17 made of copper used as a material for the connection pad 5 is formed on the whole area of the semiconductor wafer W by the sputtering method. After that, an unnecessary part (apart except for the connection pad 5) of the metal layer 17 is lifted off with the photoresist 16 by removing the latter. By this means, the connection pad 5 is formed. After that, an unnecessary part (a part other than the part where the connection pad 5 is formed) of the barrier layer 12 is removed by etching.

Figure 4D:
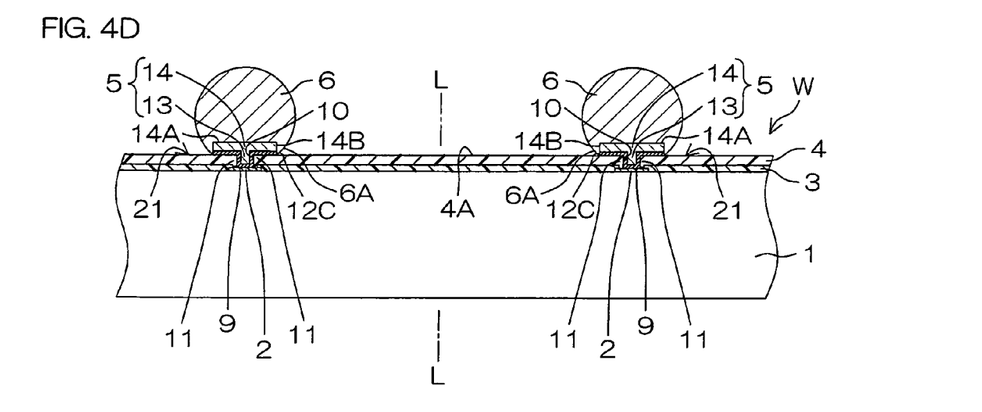
FIG. 4D is a schematic sectional view showing the manufacturing method of the semiconductor device in FIG. 1 in process order and showing the subsequent process of FIG. 4C.

Next, as shown in FIG. 4D, the generally spherical solder ball 6 covering the entire surface (the distal end face 14A and the side face 14B) of the protruding portion 14 of the connection pad 5 is formed by attaching solder to the entire surface (the distal end face 14A and the side face 14B) of the protruding portion 14. The side face 12C of the barrier layer 12 is exposed by forming the solder ball 6 so as to cover the entire surface (the distal end face 14A and the side face 14B) of the protruding portion 14. As a result, the gap 21 surrounded by the surface 4A of the stress relaxation layer 4, the side face 12C of the barrier layer 12 and the spherical face 6A of the solder ball 6 is formed on the stress relaxation layer 4.

Figure 4E:
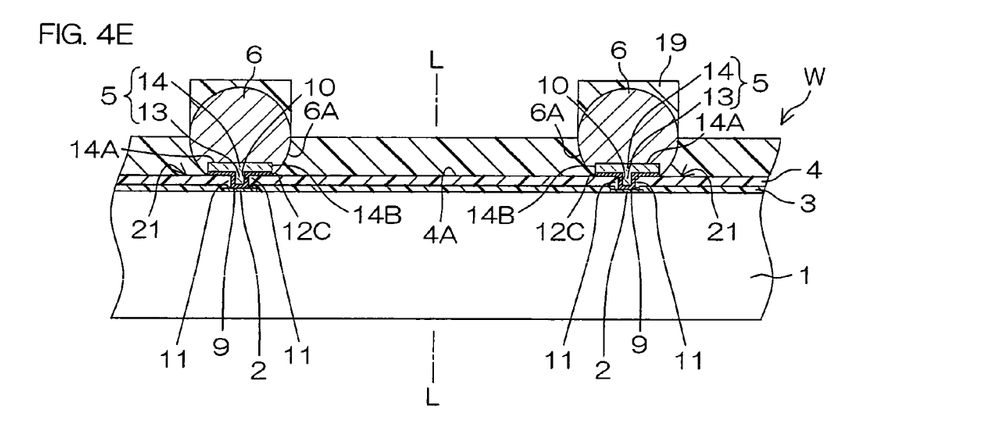
FIG. 4E is a schematic sectional view showing the manufacturing method of the semiconductor device in FIG. 1 in process order and showing the subsequent process of FIG. 4D.

Next, an organic protective layer 19 made of polyimide used as a material for the organic protective film 20 (see FIG. 3) is applied on the whole area of the semiconductor wafer W as shown in FIG. 4E. Photosensitive polyimide (for example, positive photosensitive polyimide and negative photosensitive polyimide) can be used as the organic protective layer 19, for example, and positive photosensitive polyimide is used in this embodiment.

Figure 4F:
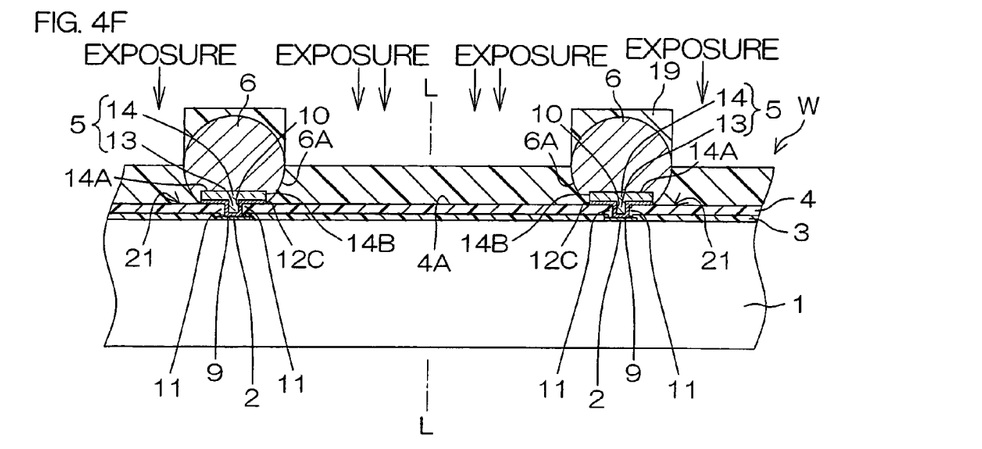
FIG. 4F is a schematic sectional view showing the manufacturing method of the semiconductor device in FIG. 1 in FIG. 4G is a schematic sectional view showing the manufacturing method of the semiconductor device in FIG. 1 in process order and showing the subsequent process of FIG. 4F.

After the application of the organic protective layer 19, a photomask (not shown) having an opening in an area except for the area where the organic protective film 20 is to be formed is arranged on the semiconductor wafer W. As shown in FIG. 4F, the organic protective layer 19 is irradiated with ultraviolet light from above the photomask (ultraviolet exposure).

Figure 4G:
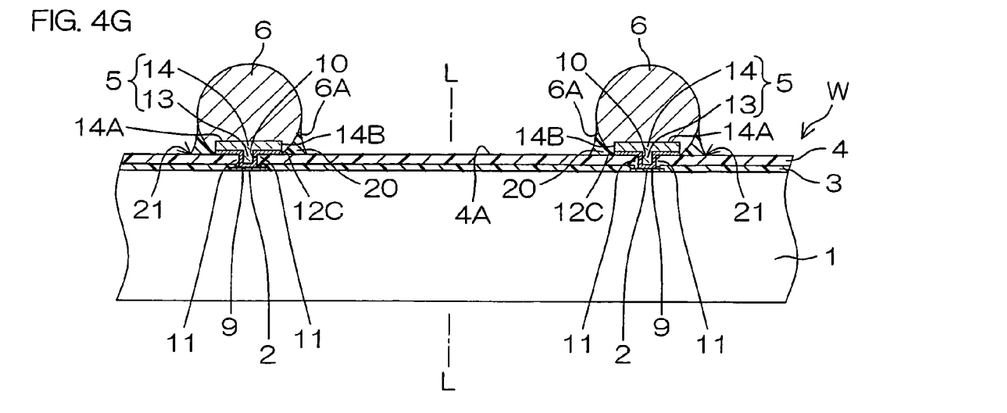
Figure 4H:
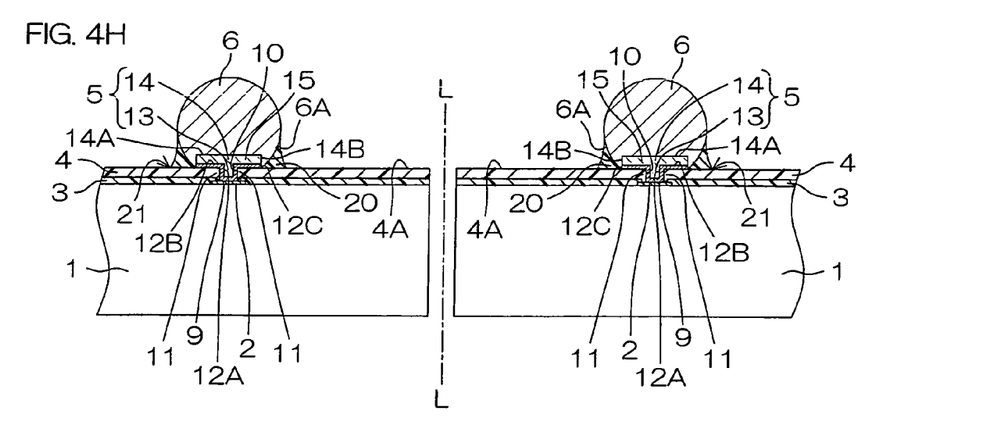
FIG. 4H is a schematic sectional view showing the manufacturing method of the semiconductor device shown in FIG. 1 in process order and showing the subsequent process of FIG. 4G.

After that, a part irradiated with the ultraviolet light (a part other than the organic protective film 20) in the organic protective layer 19 is removed as shown in FIG. 4G. By this means, the organic protective film 20 contactingly covering the side face 12C of the barrier layer 12 is formed in the gap 21. As shown in FIG. 4H, the semiconductor wafer W is cut (diced) along a dicing line L set between each semiconductor chip 1 in the semiconductor wafer W, whereby the semiconductor device with the configuration shown in FIG. 1 is obtained.

As described above, on the face exposed in the through-hole 10 on the electrode pad 2, the inner face of the through-hole 10 and the circumference 11 of the through-hole 10 on the stress relaxation layer 4, the barrier layer 12 is formed so as to cover them in this semiconductor device. On the inner face 12A within the through-hole 10 and the outer end face 12B on the stress relaxation layer 4 of the barrier layer 12, the connection pad 5 provided with the protruding portion 14 is contactingly formed. The entire surface (the distal end face 14A and the side face 14B) of the protruding portion 14 is covered by the solder ball 6 for electrical connection with outside. The side face 12C of the barrier layer 12 is covered over its periphery with the organic protective film 20.

Since the stress relaxation layer 4 made of polyimide and the barrier layer 12 made of titanium, nickel and titanium tungsten have low adherability, stripping between the stress relaxation layer 4 and the barrier layer 12 is easily caused if the connection pad 5 on the barrier layer 12 is oxidized (corroded).

In the configuration where all around the side face 12C of the barrier layer 12 is covered with the organic protective film 20 as in this semiconductor device, the connection pad 5 can be prevented from being oxidized (corroded) due to moisture exposure of the contact interface between the barrier layer 12 and the connection pad 5, so that the barrier layer 12 can be prevented from stripping off from the stress relaxation layer 4. Furthermore, the side face 14B of the protruding portion 14 of the connection pad 5 is covered with the solder ball 6 and is not exposed. By this means, too, oxidization (corrosion) of the connection pad 5 can be prevented. Accordingly, the stripping of the barrier layer 12 from the stress relaxation layer 4 can be further prevented.

As a result, stripping of the solder ball 6 from the semiconductor chip 1 associated with the stripping of the barrier layer 12 can be prevented, so that a semiconductor device with high connection reliability can be realized.

In addition, the semiconductor device is mounted on the external mounting board 7 by connecting the solder ball 6 to a pad 8 on the mounting board 7. Since the protruding portion 14 of the connection pad 5 protrudes inside of the solder ball 6 in a state where the solder ball 6 is attached to the protruding portion 14, even if stress resulting from thermal expansion/contraction of the semiconductor chip 1 and the mounting board 7 is generated on the solder ball 6 in this mounting state, a part of the stress can be relaxed by the protruding portion 14 protruding inside of the solder ball 6. Consequently, generation of a crack on the solder ball 6 can be also prevented.

Further, the circumference 15 of the protruding portion 14 projects to the circumference 11 of the through-hole 10 of the stress relaxation layer 4. Consequently, when stress is relaxed by the protruding portion 14, stress exerted on the protruding portion 14 can be transferred to the stress relaxation layer 4. Therefore, even if large stress is generated on the solder ball 6, the stress can be satisfactorily relaxed by the connection pad 5 and the stress relaxation layer 4, whereby generation of a crack on the semiconductor chip 1 can be prevented.

In addition, since the protruding portion 14 of the connection pad 5 is formed cylindrically, the side face 14B thereof has no sharp edges. Accordingly, the stress generated on the solder ball 6 can be dispersed and absorbed on the side face 14B of the protruding portion 14 (the cylinder).

Figure 5:
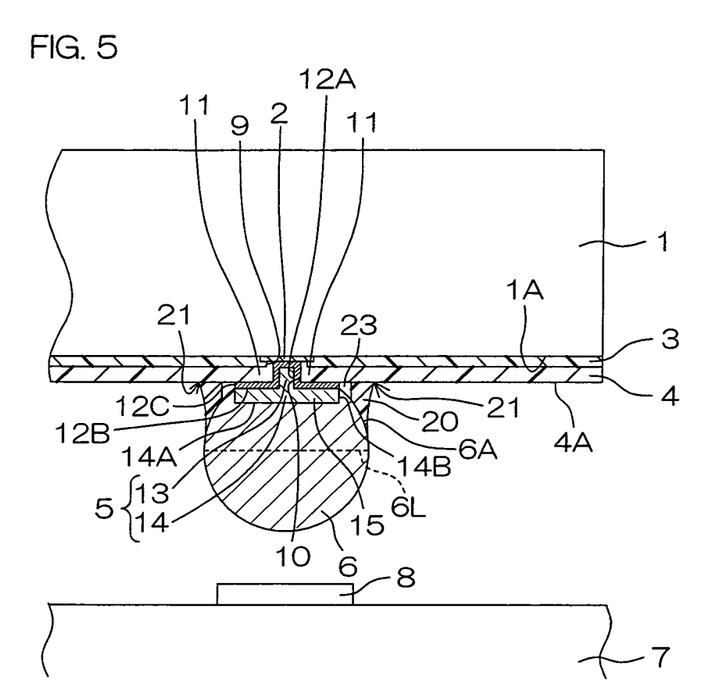
FIG. 5 is a schematic sectional view showing a modification of the semiconductor device shown in FIG. 1, wherein an organic protective film is in another configuration.

Further, the organic protective film 20 is configured to be formed so as to contactingly cover the side face 12C of the barrier layer 12 in the gap 21 in this embodiment. However, the organic protective film 20 can have another configuration if contact between an exposed portion (the side face 12C in this embodiment) of the barrier layer 12 and the outside can be avoided. For example, the organic protective film 20 may be formed so as to form a space 23 between the organic protective film 20 and the side face 12C of the barrier layer 12 as shown in FIG. 5.

As above, the embodiment of the present invention is explained. However, the present invention can be carried out in other embodiments.

Figure 6:
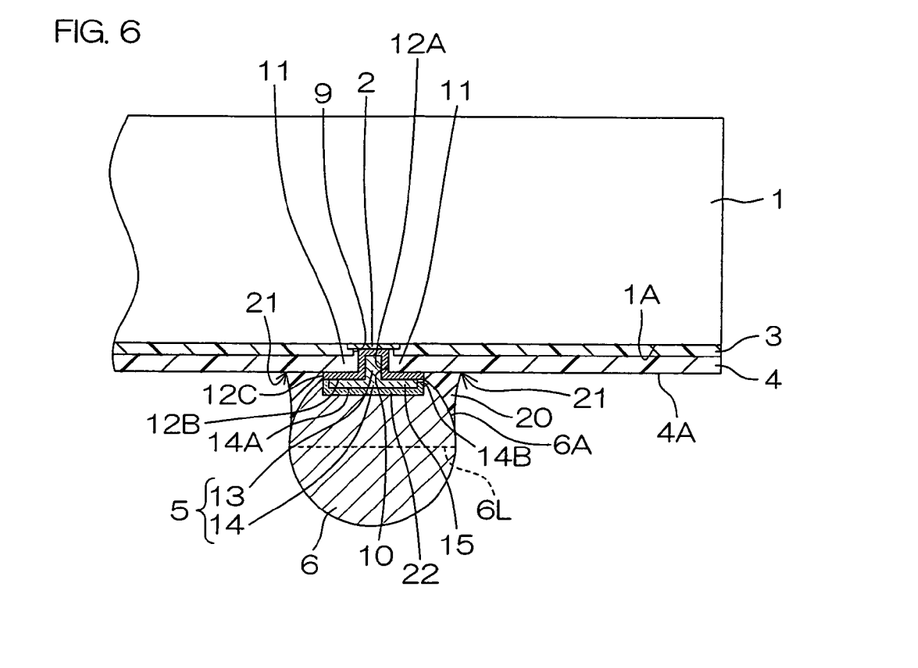
FIG. 6 is a schematic sectional view of a modification of the semiconductor device shown in FIG. 1, wherein a connection pad is in another configuration.

For example, the connection pad 5 is formed using copper in the foregoing embodiment. However, the material is not limited to copper if a metal has solder wettability. The connection pad 5 may be formed using gold, for example. In this case, it is preferable to form a diffusion prevention layer 22 made of nickel for preventing gold from being diffused, on an interface between the protruding portion 14 of the connection pad 5 and the solder ball 6, as shown in FIG. 6, for example.

Figure 7:
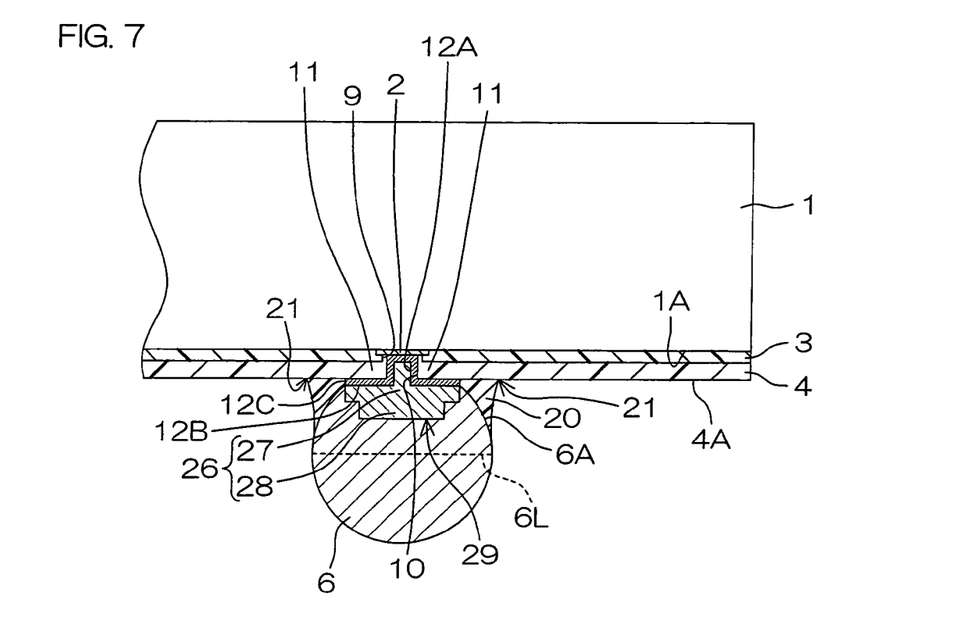
FIG. 7 is a schematic sectional view of a modification of the semiconductor device shown in FIG. 1, wherein a protruding portion of the connection pad is in another configuration.
Figure 8:
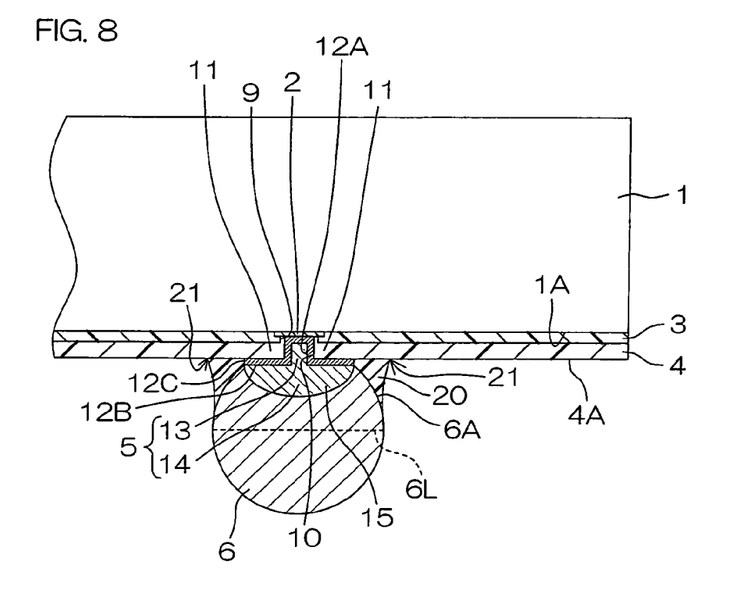
FIG. 8 is a schematic sectional view of a modification of the semiconductor device shown in FIG. 1, wherein the protruding portion of the connection pad is in still another configuration.

Alternatively, for example, the protruding portion 14 of the connection pad 5 is formed cylindrically in the foregoing embodiment. However, a metal pad 29 having a protruding portion 26 including an upper protruding portion 27 arranged at a side of the stress relaxation layer 4 in the laminating direction and a lower protruding portion 28 integrally formed on the underside of the upper protruding portion 27 may be formed instead of the connection pad 5, as shown in FIG. 7, for example. Alternatively, for example, the connection pad 5 may be formed in a semi-elliptic spherical shape as shown in FIG. 8.

As for the configuration of the electrode pads 2 on the semiconductor chip 1 in the foregoing embodiment, the electrode pads 2 are arranged in two rows rectangularly annular when viewed in plan view and along the outer periphery of the semiconductor chip 1. However, the arrangement is not limited to being rectangularly annular and may be a matrix form, for example, if the electrode pads 2 are arranged regularly on the function face 1A of the semiconductor chip 1.

Furthermore, the semiconductor device of the WL-CSP type is given as an example in the above-mentioned embodiment. However, the present invention can be applied to a semiconductor device other than the semiconductor device of the WL-CSP type, wherein a semiconductor chip is mounted (bare-chip mounted) with its front side set to face a mounting board and its back side exposed.

Although the embodiments of the present invention are explained in detail, they are merely exemplary to clarify technical contents of the present invention. The present invention should not be construed as being limited to the embodiments, and the spirit and scope of the present invention is to be limited only by the scope of the appended claims.

The present application corresponds to Japanese patent application No. 2006-348572 filed with Japan Patent Office on Dec. 25, 2006. The entire disclosure thereof is hereby incorporated by reference.

What is claimed is:

1. A semiconductor device comprising:
    a semiconductor chip;
    an internal pad for electrical connection formed on a surface of the semiconductor chip;
    a stress relaxation layer formed on the semiconductor chip and having a through-hole at a position opposed to the internal pad;
    an under-bump layer formed so as to cover a face exposed in the through-hole on the internal pad, an inner face of the through-hole and a circumference of the through-hole on the stress relaxation layer;
    a protective layer formed on the stress relaxation layer, encompassing a periphery of the under-bump layer and covering directly the under-bump layer while preventing a side face of the under-bump layer from being exposed;
    a connection pad composed of a buried portion completely filling the through-hole and a protruding portion including an upper protruding portion protruding on the stress relaxation layer and a lower protruding portion formed on and narrower than the upper protruding portion; and
    a solder terminal for electrical connection with outside formed on the connection pad so as to cover an entire surface of the protruding portion,
    wherein a width of an opening of the through-hole in the stress relaxation layer is smaller than a width of the circumference of the through-hole covered by the protruding portion,
    wherein the protective layer is formed only at a circumference of the under-bump layer on a side toward the stress relaxation layer with respect to a center position of the solder terminal in a laminating direction of the semiconductor chip and the stress relaxation layer,
    wherein a height of the protective layer measured from the stress relaxation layer is larger than a height of the protruding portion of the connection pad measured in the same way, and
    wherein the protective layer is formed only at a region between a circumference of the solder terminal and a circumference of the protruding portion when viewed in plan.

2. The semiconductor device according to claim 1, wherein the protruding portion is formed cylindrically.

3. The semiconductor device according to claim 1, wherein the connection pad is made of a metal having solder wettability.

4. The semiconductor device according to claim 1, wherein the connection pad is made of copper or gold.

5. The semiconductor device according to claim 1, wherein a layer made of nickel is formed on an interface between the protruding portion and the solder terminal.

6. The semiconductor device according to claim 1, wherein the protective layer is formed annular.

7. The semiconductor device according to claim 1, wherein the relaxation layer comprises polyimide.

8. The semiconductor device according to claim 1, wherein the under-bump layer includes a barrier layer to preventing the internal pad from corroding.

9. The semiconductor device according to claim 8, wherein the barrier layer is made of a metal material comprising at least one of titanium and nickel.

10. The semiconductor device according to claim 8, wherein the barrier layer is configured so as to cover a face exposed in the through-hole on the internal pad, an inner face of the through-hole and a circumference of the through-hole on the stress relaxation layer.

11. The semiconductor device according to claim 8, wherein the barrier layer is generally circular when viewed in plan.

12. The semiconductor device according to claim 8, wherein a thickness of the barrier layer is in a range from 1000 Å to 2000 Å.

13. The semiconductor device according to claim 8, wherein the connection pad is configured so as to contact with an inner surface of the barrier layer within the through-hole and an outer end surface of the barrier layer on the stress relaxation layer.

14. The semiconductor device according to claim 8, wherein a side surface of the barrier layer is exposed from the connection pad.

15. The semiconductor device according to claim 1, wherein the internal pad comprises aluminum and is generally rectangular when viewed in plan.

16. The semiconductor device according to claim 1, wherein the semiconductor chip is formed with a plurality of the internal pad.

17. The semiconductor device according to claim 16, wherein the plurality of the internal pad are arranged along an outer periphery of the semiconductor chip.

18. The semiconductor device according to claim 16, wherein the plurality of the internal pad are arranged in two rows rectangularly and annularly when viewed in plan along an outer periphery of the semiconductor chip.

19. The semiconductor device according to claim 18, wherein a spacing is provided between each part of adjacent internal pads.

20. The semiconductor device according to claim 1, wherein a surface protective film is provided between the semiconductor chip and the stress relaxation layer.

21. The semiconductor device according to claim 20, wherein the surface protective film comprises at least one of silicon oxide and silicon nitride.

22. The semiconductor device according to claim 20, wherein the surface protective film is formed with a pad opening for exposing the internal pad.

23. The semiconductor device according to claim 20, wherein the stress relaxation layer is formed so as to cover an entire surface of the surface protective film.

24. The semiconductor device according to claim 1, wherein a height of the protruding portion is in a range from 10 μm to 50 μm.

25. The semiconductor device according to claim 1, wherein the protruding portion is configured in a semi-elliptic spherical shape.

26. The semiconductor device according to claim 1, wherein the protective layer is an organic protective film comprising organic material.

27. The semiconductor device according to claim 26, wherein the organic protective film comprises photosensitive polyimide.

28. A semiconductor device comprising:
a semiconductor chip;
an internal pad for electrical connection formed on a surface of the semiconductor chip;
a stress relaxation layer formed on the semiconductor chip and having a through-hole at a position opposed to the internal pad;
an under-bump layer formed so as to cover a face exposed in the through-hole on the internal pad, an inner face of the through-hole and a circumference of the through-hole on the stress relaxation layer;
a protective layer formed on the stress relaxation layer, encompassing a periphery of the under-bump layer and covering directly the under-bump layer while preventing a side face of the under-bump layer from being exposed;
a connection pad composed of a buried portion completely filling the through-hole and a protruding portion including an upper protruding portion protruding on the stress relaxation layer and a lower protruding portion formed on and narrower than the upper protruding portion; and
a solder terminal for electrical connection with outside formed on the connection pad so as to cover an entire surface of the protruding portion,
wherein the protective layer is formed only at a circumference of the under-bump layer on a side toward the stress relaxation layer with respect to a center position of the solder terminal in a laminating direction of the semiconductor chip and the stress relaxation layer,
wherein a height of the protective layer measured from the stress relaxation layer is larger than a height of the protruding portion of the connection pad measured in the same way, and
wherein the protective layer is formed only at a region between a circumference of the solder terminal and a circumference of the protruding portion when viewed in plan, and
wherein the through-hole is deeper than a height of the internal pad.

29. The semiconductor device according to claim 28, wherein the protruding portion is formed cylindrically.

30. The semiconductor device according to claim 28, wherein the connection pad is made of a metal having solder wettability.

31. The semiconductor device according to claim 28, wherein the connection pad is made of copper or gold.

32. The semiconductor device according to claim 28, wherein a layer made of nickel is formed on an interface between the protruding portion and the solder terminal.

33. The semiconductor device according to claim 28, wherein the protective layer is formed annular.

34. The semiconductor device according to claim 28, wherein the relaxation layer comprises polyimide.

35. The semiconductor device according to claim 28, wherein the under-bump layer includes a barrier layer to preventing the internal pad from corroding.

36. The semiconductor device according to claim 35, wherein the barrier layer is made of a metal material comprising at least one of titanium and nickel.

37. The semiconductor device according to claim 35, wherein the barrier layer is configured so as to cover a face exposed in the through-hole on the internal pad, an inner face of the through-hole and a circumference of the through-hole on the stress relaxation layer.

38. The semiconductor device according to claim 35, wherein the barrier layer is generally circular when viewed in plan.

39. The semiconductor device according to claim 35, wherein a thickness of the barrier layer is in a range from 1000 Å to 2000 Å.

40. The semiconductor device according to claim 35, wherein the connection pad is configured so as to contact with an inner surface of the barrier layer within the through-hole and an outer end surface of the barrier layer on the stress relaxation layer.

41. The semiconductor device according to claim 35, wherein a side surface of the barrier layer is exposed from the connection pad.

42. The semiconductor device according to claim 28, wherein the internal pad comprises aluminum and is generally rectangular when viewed in plan.

43. The semiconductor device according to claim 28, wherein the semiconductor chip is formed with a plurality of the internal pad.

44. The semiconductor device according to claim 43, wherein the plurality of the internal pad are arranged along an outer periphery of the semiconductor chip.

45. The semiconductor device according to claim 43, wherein the plurality of the internal pad are arranged in two rows rectangularly and annularly when viewed in plan along an outer periphery of the semiconductor chip.

46. The semiconductor device according to claim 45, wherein a spacing is provided between each part of adjacent internal pads.

47. The semiconductor device according to claim 28, wherein a surface protective film is provided between the semiconductor chip and the stress relaxation layer.

48. The semiconductor device according to claim 47, wherein the surface protective film comprises at least one of silicon oxide and silicon nitride.

49. The semiconductor device according to claim 47, wherein the surface protective film is formed with a pad opening for exposing the internal pad.

50. The semiconductor device according to claim 47, wherein the stress relaxation layer is formed so as to cover an entire surface of the surface protective film.

51. The semiconductor device according to claim 28, wherein a height of the protruding portion is in a range from $10\ \mu m$ to $50\ \mu m$.

52. The semiconductor device according to claim 28, wherein the protruding portion is configured in a semi-elliptic spherical shape.

53. The semiconductor device according to claim 28, wherein the protective layer is an organic protective film comprising organic material.

54. The semiconductor device according to claim 53, wherein the organic protective film comprises photosensitive polyimide.

* * * * *